US010881020B1

(12) United States Patent
Liu et al.

(10) Patent No.: US 10,881,020 B1
(45) Date of Patent: Dec. 29, 2020

(54) IMMERSION COOLING MODULE AND ELECTRONIC APPARATUS HAVING THE SAME

(71) Applicant: Wiwynn Corporation, New Taipei (TW)

(72) Inventors: Tsung-Lin Liu, New Taipei (TW); Ting-Yu Pai, New Taipei (TW); Shih-Lung Lin, New Taipei (TW); Chin-Han Chan, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 0 days.

(21) Appl. No.: 16/558,185

(22) Filed: Sep. 2, 2019

(30) Foreign Application Priority Data

Jun. 17, 2019 (TW) .............................. 108120829 A

(51) Int. Cl.
*H05K 7/20* (2006.01)
*F28F 9/02* (2006.01)

(52) U.S. Cl.
CPC ..... *H05K 7/20318* (2013.01); *H05K 7/20327* (2013.01); *H05K 7/20554* (2013.01); *H05K 7/20663* (2013.01); *F28F 9/0265* (2013.01); *H05K 7/203* (2013.01); *H05K 7/208* (2013.01)

(58) Field of Classification Search
CPC .... H05K 7/203; H05K 7/208; H05K 7/20809; H05K 7/20318; H05K 7/20554; H05K 7/20663; F28D 15/02; F28F 9/002; F28F 9/0265
See application file for complete search history.

(56) References Cited

U.S. PATENT DOCUMENTS

| 8,194,406 B2* | 6/2012 | Campbell | H05K 7/203 361/698 |
| 8,917,513 B1* | 12/2014 | Hazzard | H05K 7/1498 361/724 |
| 8,953,317 B2* | 2/2015 | Campbell | H05K 7/203 165/104.33 |
| 8,953,320 B2* | 2/2015 | Campbell | H05K 7/20809 165/104.21 |

(Continued)

FOREIGN PATENT DOCUMENTS

CN 107924896 4/2018

OTHER PUBLICATIONS

"Office Action of Taiwan Counterpart Application", dated May 18, 2020, p. 1-p. 11.

*Primary Examiner* — Zachary Pape
(74) *Attorney, Agent, or Firm* — JCIPRNET

(57) ABSTRACT

An electronic apparatus including a box body, at least one heat generating element and an immersion cooling module are provided. The immersion cooling module includes a condensing structure and an airflow guiding device. The box body has a containing space, and the containing space is adapted to contain a heat dissipation medium. The heat generating element is disposed in the containing space to be immersed in the heat dissipation medium which is in the liquid state. The condensing structure is disposed in the containing space and includes a first condensing portion. The airflow guiding device is disposed in the box body and is adapted to guide the heat dissipation medium which is in the gaseous state toward the first condensing portion.

20 Claims, 12 Drawing Sheets

(56) References Cited

U.S. PATENT DOCUMENTS

| | | | |
|---|---|---|---|
| 10,512,192 B2 * | 12/2019 | Miyoshi | H01L 21/67184 |
| 2017/0112017 A1 * | 4/2017 | Wang | H05K 7/20236 |
| 2018/0246550 A1 | 8/2018 | Inaba et al. | |
| 2019/0357379 A1 * | 11/2019 | Kolar | H05K 7/20827 |

* cited by examiner

IMMERSION COOLING MODULE AND ELECTRONIC APPARATUS HAVING THE SAME

CROSS-REFERENCE TO RELATED APPLICATION

This application claims the priority benefit of Taiwan application serial no. 108120829, filed on Jun. 17, 2019. The entirety of the above-mentioned patent application is hereby incorporated by reference herein and made a part of this specification.

BACKGROUND

Technical Field

The present disclosure relates to an immersion cooling module and an electronic apparatus having the same, and more particularly to an immersion cooling module having an airflow guiding device and an electronic apparatus having the same.

Description of Related Art

As the performance of server grows rapidly, the high-performance server generates a lot of waste heat. In order to avoid the poor operation of the host caused by the accumulation of waste heat, some servers are designed to immerse the mainboard in heat dissipation liquid, and the heat dissipation liquid absorbs the heat generated by the heat generating elements of the mainboard and is gasified and condensed on the condensing pipeline. The heat dissipation droplets condensed on the condensing pipeline are returned to the heat dissipation liquid through gravity, thereby circulating to achieve the heat dissipation effect, which is known as the two-phase immersion cooling technology in the field. The cost of the heat dissipation liquid is usually expensive, and if the heat dissipation liquid is unexpectedly dissipated to the outside after being gasified, the maintenance cost of the server will be excessively increased.

SUMMARY

The disclosure provides an electronic apparatus, which can prevent the heat dissipation medium from escaping to the outside, and can increase the condensation efficiency of the heat dissipation medium and improve the heat dissipation capability of the electronic apparatus.

The electronic apparatus of the present disclosure includes a box body, at least one heat generating element and an immersion cooling module. The immersion cooling module includes a condensing structure and an airflow guiding device. The box body has a containing space, and the containing space is adapted to contain a heat dissipation medium. The heat generating element is disposed in the containing space and immersed in the liquid heat dissipation medium, wherein the liquid heat dissipation medium is adapted to be gasified into a gaseous heat dissipation medium through the thermal energy of the heat generating element. The condensing structure is disposed in the containing space and includes a first condensing portion. The airflow guiding device is disposed in the box body, and is adapted to guide the gaseous heat dissipation medium toward the first condensing portion.

The immersion cooling module of the present disclosure is adapted for an electronic apparatus, the electronic apparatus includes a box body and at least one heat generating element. The box body has a containing space, and the containing space is adapted to contain a heat dissipation medium. The heat generating element is disposed in the containing space and immersed in the liquid heat dissipation medium. The immersion cooling module includes a condensing structure and an airflow guiding device. The condensing structure is disposed in the containing space and includes a first condensing portion. The airflow guiding device is disposed in the box body, and is adapted to guide the gaseous heat dissipation medium toward the first condensing portion.

In an embodiment of the disclosure, the electronic apparatus includes a cover body, wherein the cover body is adapted to cover the box body to seal the containing space, and the cover body is adapted to be opened relative to the box body to expose the containing space to the outside environment.

In an embodiment of the disclosure, when the cover body is opened relative to the box body, the airflow guiding device is activated.

In an embodiment of the present disclosure, the immersion cooling module includes at least one sensor disposed in the containing space. When the sensor senses that the temperature of the air in the containing space is higher than a temperature threshold or the air pressure in the containing space is higher than a pressure threshold, the airflow guiding device is activated.

In an embodiment of the disclosure, the immersion cooling module includes a control unit, wherein when the sensor senses that the temperature of the air in the containing space is higher than a temperature threshold or the air pressure in the containing space is higher than the pressure threshold, the control unit controls the flow speed of the condensate in the condensing structure to increase.

In an embodiment of the disclosure, the sensor includes at least one of a temperature sensor and a pressure sensor.

In an embodiment of the disclosure, the airflow guiding device includes at least one airflow generating device and an airflow passage, and the at least one airflow generating device is adapted to generate a guiding airflow. The guiding airflow drives the gaseous heat dissipation medium to flow along the airflow passage to the first condensing portion.

In an embodiment of the disclosure, the airflow passage includes at least one conduit, and the at least one conduit extends along an edge of the containing space and has at least one air inlet.

In an embodiment of the disclosure, the at least one air inlet includes a plurality of air inlets, and the apertures of the air inlet are proportional to the distance between the air inlets and the at least one airflow generating device.

In an embodiment of the disclosure, the condensing structure includes a second condensing portion, the second condensing portion is located under the at least one conduit, and the at least one air inlet faces the second condensing portion.

In an embodiment of the disclosure, the condensing structure includes a second condensing portion, the second condensing portion is surrounded by the at least one conduit, and the at least one air inlet faces the second condensing portion.

In an embodiment of the disclosure, the airflow guiding device includes a mask connected between the at least one airflow generating device and the airflow passage, and the guiding airflow from the airflow passage is adapted to pass through the mask to flow toward the at least one airflow generating device.

In an embodiment of the disclosure, a segment of the airflow passage is connected to the mask, and the guiding airflow flows toward the center of the segment along a flow direction. The airflow guiding device includes a plurality of stoppers. The stoppers are disposed in the segment and arranged along the flow direction. The length of the stoppers is inversely proportional to the distance between the stoppers and the center of the segment.

In an embodiment of the disclosure, the at least one airflow generating device and the airflow passage are formed in a side wall of the box body.

In an embodiment of the disclosure, the condensing structure includes a second condensing portion, and the second condensing portion extends along an edge of the containing space.

In an embodiment of the disclosure, the electronic apparatus includes a display interface, wherein the display interface is disposed outside the box body and is adapted to display physical measurement parameters and images in the containing space.

In an embodiment of the disclosure, the electronic apparatus is a server, a storage or an exchanger.

In order to make the aforementioned features and advantages of the disclosure more comprehensible, embodiments accompanying figures are described in detail below.

DESCRIPTION OF THE EMBODIMENTS

Figure 1:
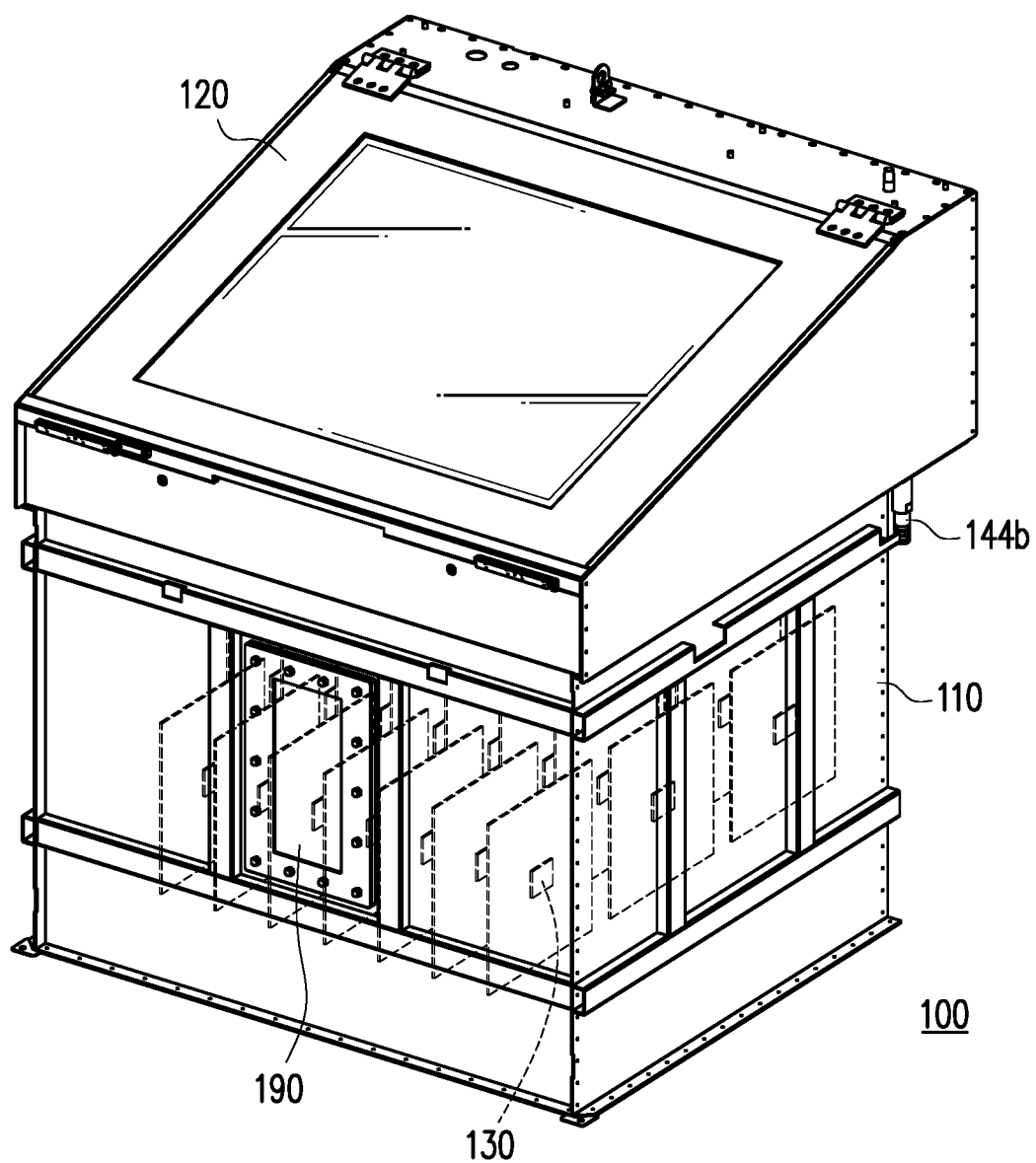
FIG. 1 is a perspective view of an electronic apparatus according to an embodiment of the present disclosure.
Figure 2:
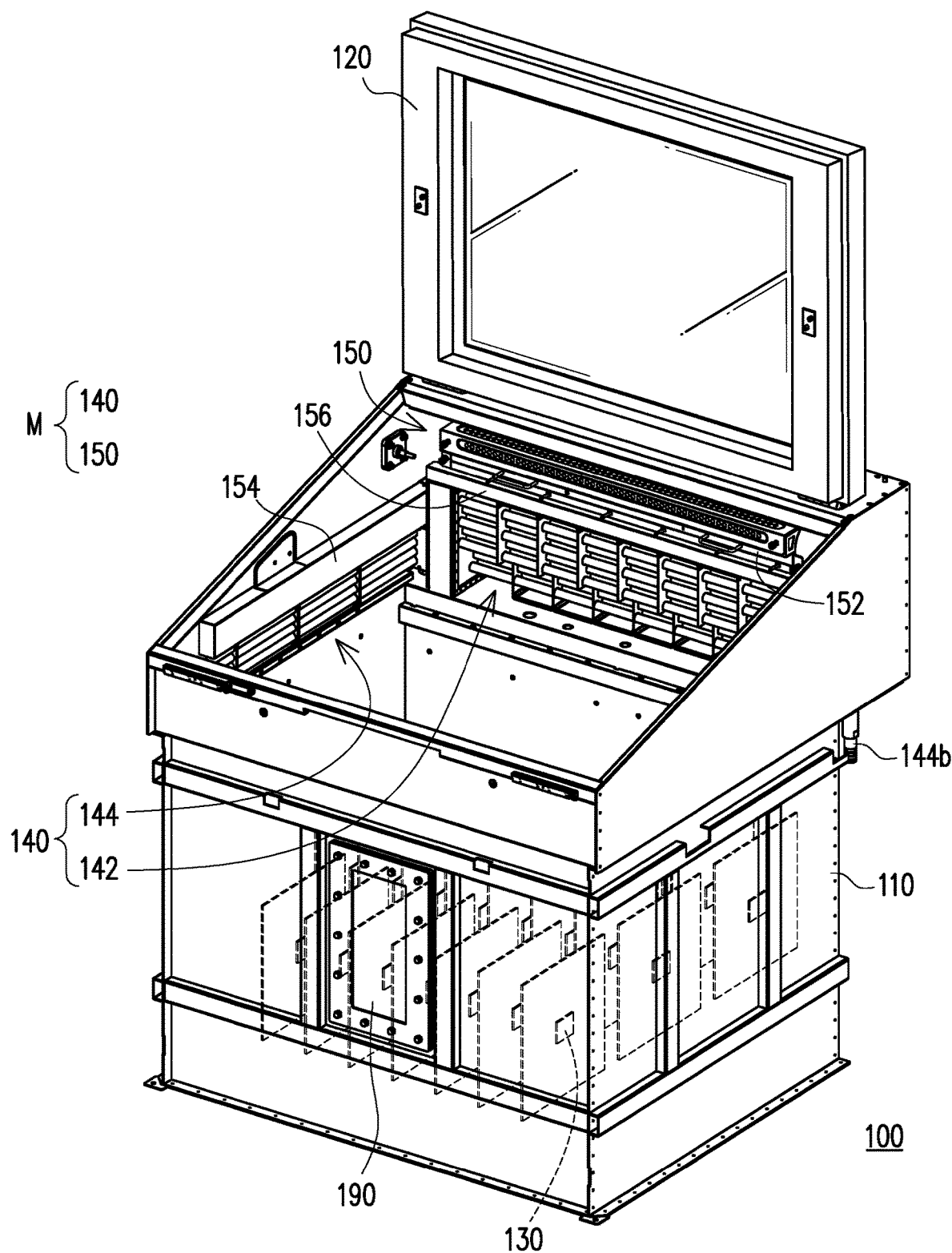
FIG. 2 illustrates a cover body of FIG. 1 opened relative to a box body.
Figure 3:
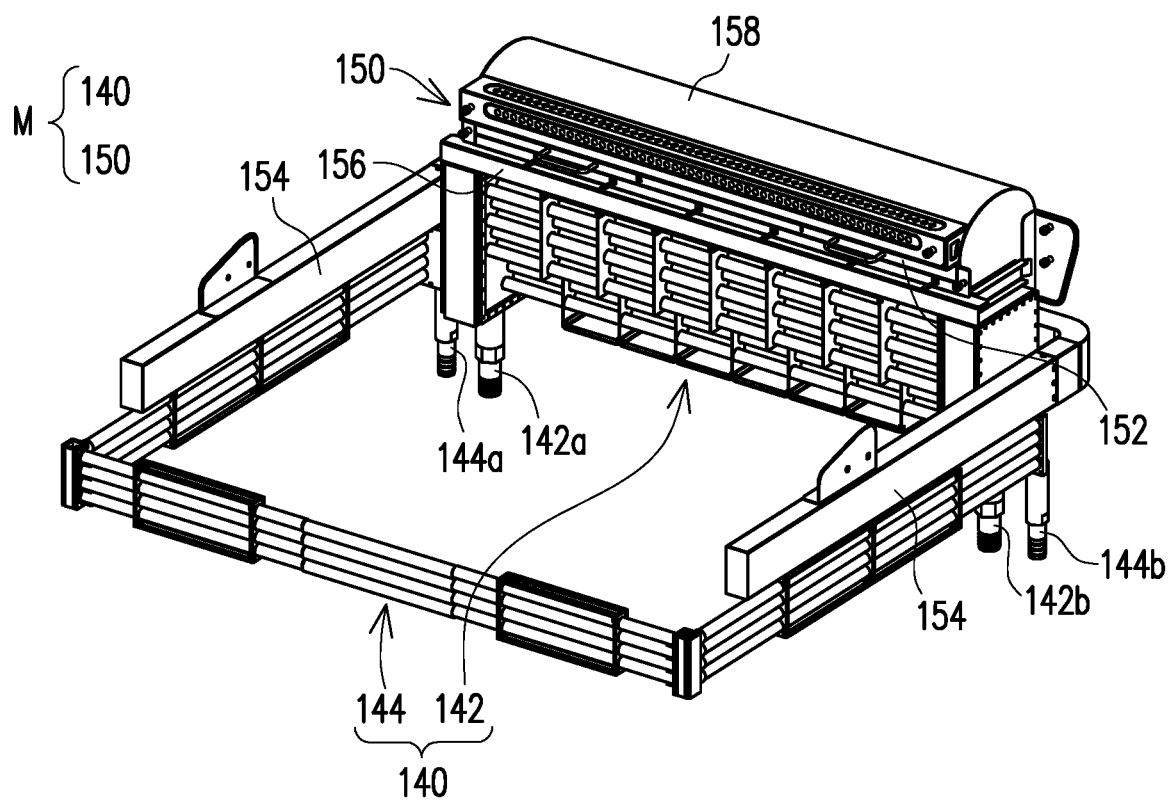
FIG. 3 is a perspective view of a condensing structure and an airflow guiding device of FIG. 1.
Figure 4:
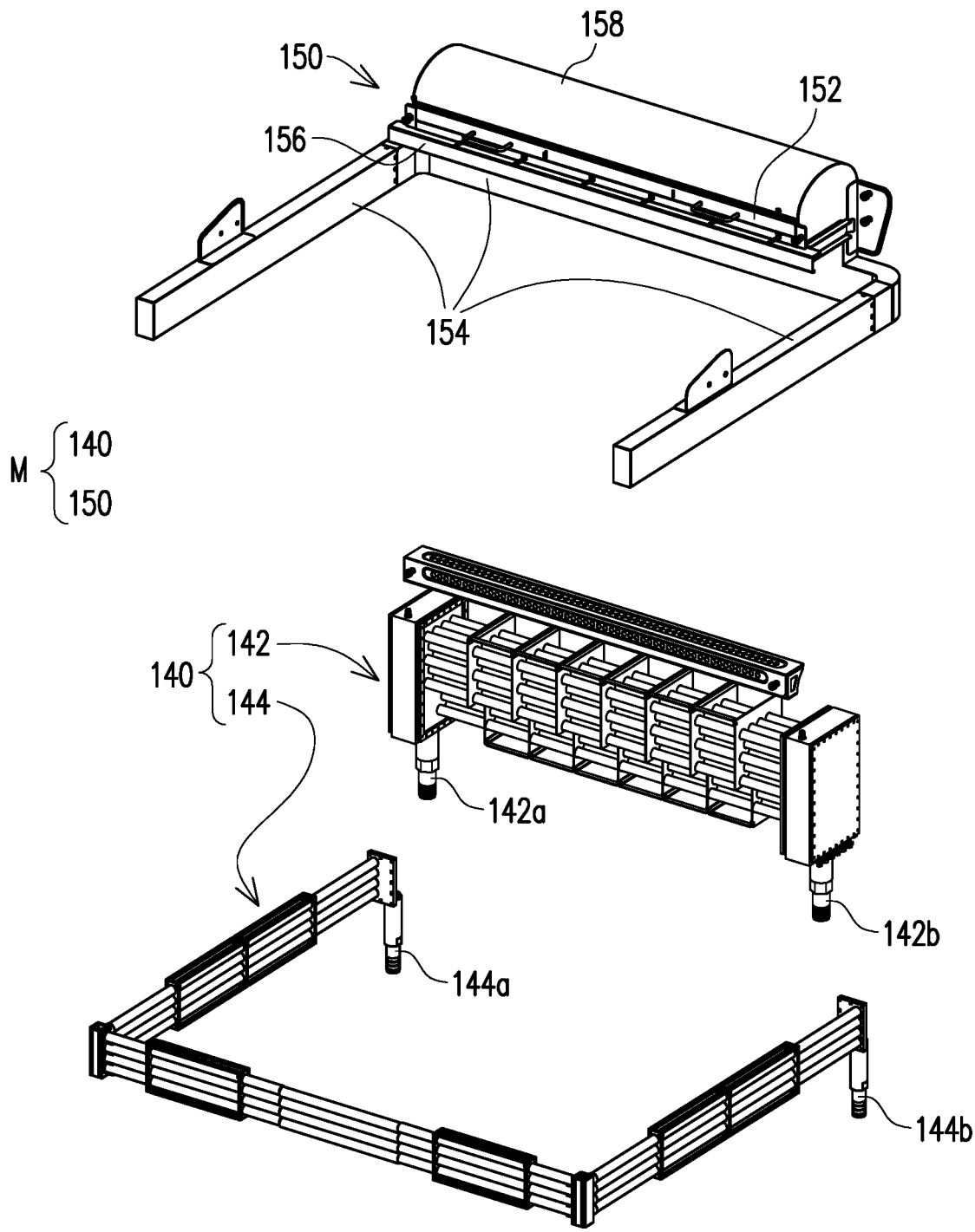
FIG. 4 is an exploded view of the condensing structure and the airflow guiding device of FIG. 3.

FIG. 1 is a perspective view of an electronic apparatus according to an embodiment of the present disclosure. FIG. 2 illustrates a cover body of FIG. 1 opened relative to a box body. FIG. 3 is a perspective view of a condensing structure and an airflow guiding device of FIG. 1. FIG. 4 is an exploded view of the condensing structure and the airflow guiding device of FIG. 3. Referring to FIG. 1 to FIG. 4, an electronic apparatus 100 of the embodiment is, for example, a server, a storage or an exchanger, and includes a box body 110, a cover body 120, at least one heat generating element 130, and an immersion cooling module M. The immersion cooling module M includes a condensing structure 140 and an airflow guiding device 150. The containing space of the box body 110 is adapted to contain a heat dissipation medium. The heat generating element 130 is disposed in the containing space of the box body 110 and immersed in the liquid heat dissipation medium. The heat generating element 130 is, for example, a central processing unit or other kinds of chips on a plurality of pluggable mainboards in the server, the present disclosure provides no limitation thereto. The liquid heat dissipation medium is gasified into a gaseous heat dissipation medium through the thermal energy of the heat generating element 130.

The condensing structure 140 is disposed in the containing space of the box body 110 and includes a first condensing portion 142 and a second condensing portion 144. The first condensing portion 142 is, for example, a main condensing portion, and the second condensing portion 144 is, for example, a sub-condensing portion and extends along an edge of the containing space of the box body 110 without occupying and blocking the electronic element configuration region in the center of the containing space. The first condensing portion 142 is, for example, a condensing pipe set and has a condensate inlet 142a and a condensate outlet 142b for inputting and outputting the external condensate. Similarly, the second condensing portion 144 is, for example, a condensing pipe set and has a condensate inlet 144a and a condensate outlet 144b for inputting and outputting the external condensate.

The heat dissipation medium is, for example, a dielectric solution which is in the liquid state at normal temperature, and is, for example, a fluorinated liquid having a boiling point of 40° C. to 60° C. or other suitable heat dissipation medium, the present disclosure provides no limitation thereto. The liquid heat dissipation medium absorbs the heat generated by the heat generating element 130 (such as a central processing unit or other type of chip on the mainboard in the server) to decrease the temperature of the heat generating element 130, and is boiled and gasified rapidly through the heat generated by the heat generating element 130. When a gaseous heat dissipation medium having high thermal energy flows to the condensing structure 140 in the sealed containing space, it is cooled by the low-temperature condensate flowing in the condensing structure 140 and condensed on the condensing structure 140. The condensate in the condensing structure 140 absorbs the thermal energy from the heat dissipation medium and then flows to the outside of the electronic apparatus 100 for heat exchange to be cooled, and the cooled condensate flows back to the condensing structure 140, thereby continuously circulating. On the other hand, the droplets of the heat dissipation medium condensed on the condensing structure 140 fall back into the liquid heat dissipation medium through gravity, thereby circulating to achieve the heat dissipation effect. The cover body 120 is adapted to cover the box body 110 to seal the containing space of the box body 110 as shown in FIG. 1, so that the heat dissipation medium performs the above-mentioned circulation in the sealed containing space. Moreover, the cover body 120 is adapted to be opened relative the box body 110 as shown in FIG. 2 to expose the containing space of the box body 110 to the outside environment, so as to facilitate maintenance of the electronic apparatus 100 or removal or replacement of elements.

The airflow guiding device 150 is disposed in the box body 110. When the cover body 120 is opened relative to the box body 110, the airflow guiding device 150 can be activated to guide the gaseous heat dissipation medium toward the first condensing portion 142 to be instantly condensed into a liquid state. In this manner, it is possible to prevent the gaseous heat dissipation medium from unexpectedly escaping to the outside when the cover body 120 is opened. In addition, the gaseous heat dissipation medium is forcibly guided to the condensing structure 140 through the airflow guiding device 150 to increase the condensation efficiency of the heat dissipation medium, thereby improving the heat dissipation capability of the electronic apparatus 100.

Figure 5:
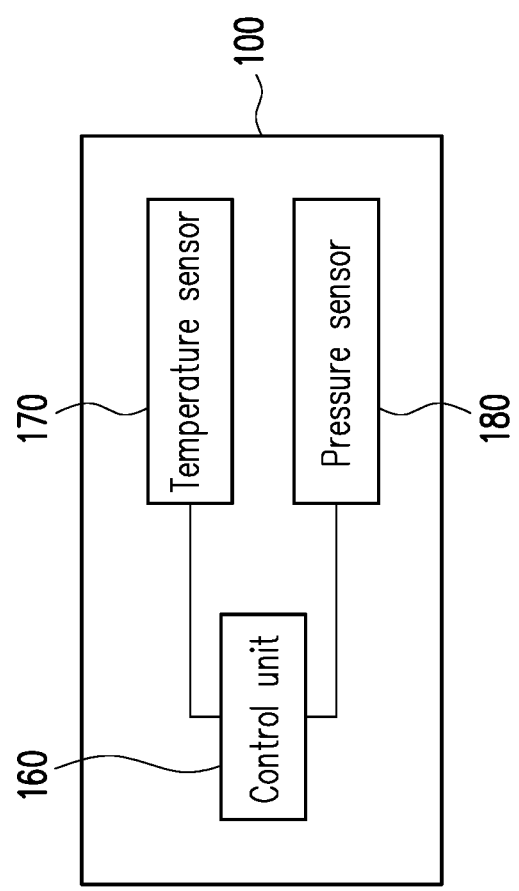
FIG. 5 is a schematic view of some elements of the electronic apparatus of FIG. 1.
Figure 11:
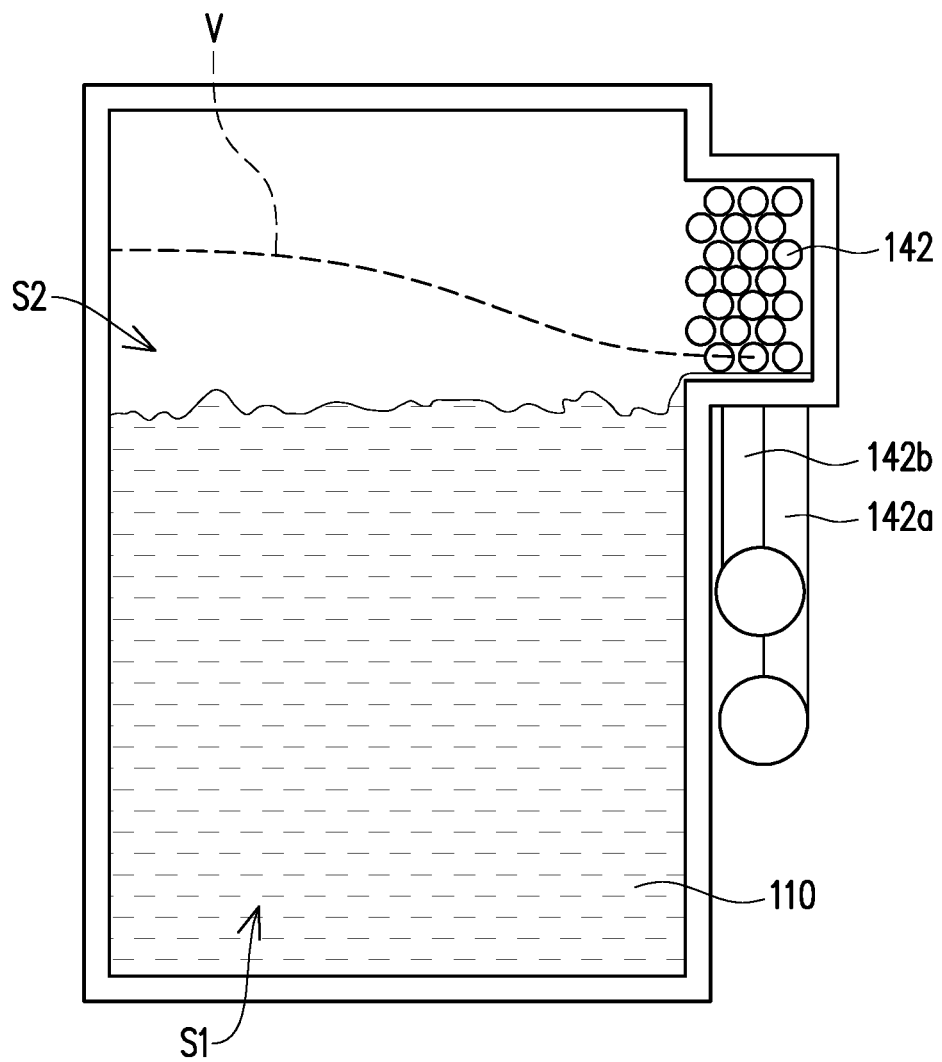
FIG. 11 illustrates a vapor line in the containing space of the box body of FIG. 1.

Please refer to FIG. 11 first, which schematically shows the box body 110 and its containing space, wherein a gaseous heat dissipation medium S2 is distributed between the vapor line V and the liquid surface of the liquid heat dissipation medium S1, and the air having smaller gravity than the gaseous heat dissipation medium S2 is located above the vapor line. The higher the temperature and/or pressure in the containing space, the more the amount of the gaseous heat dissipation medium S2, that is, the higher the position of the vapor line V, the more likely the gaseous heat dissipation medium S2 will escape to the outside. FIG. 5 is a schematic view of some elements of the electronic apparatus of FIG. 1. As shown in FIG. 5, the electronic apparatus 100 of the embodiment further includes a control unit 160, a temperature sensor 170, and a pressure sensor 180. The temperature sensor 170 and the pressure sensor 180 are disposed in the containing space of the box body 110 and respectively configured for sensing the temperature of the air and the air pressure in the containing space. The control unit 160 is coupled to the temperature sensor 170 and the pressure sensor 180, and can determine the level of the vapor line V in the containing space according to at least one of an air temperature sensed by the temperature sensor 170 and an air pressure sensed by the pressure sensor 180, thereby controlling the activation of the airflow guiding device 150 and controlling whether the flow speed of the condensate in the condensing structure 140 is increased or not. The following is a detailed description of the relevant actuation process.

Figure 6:
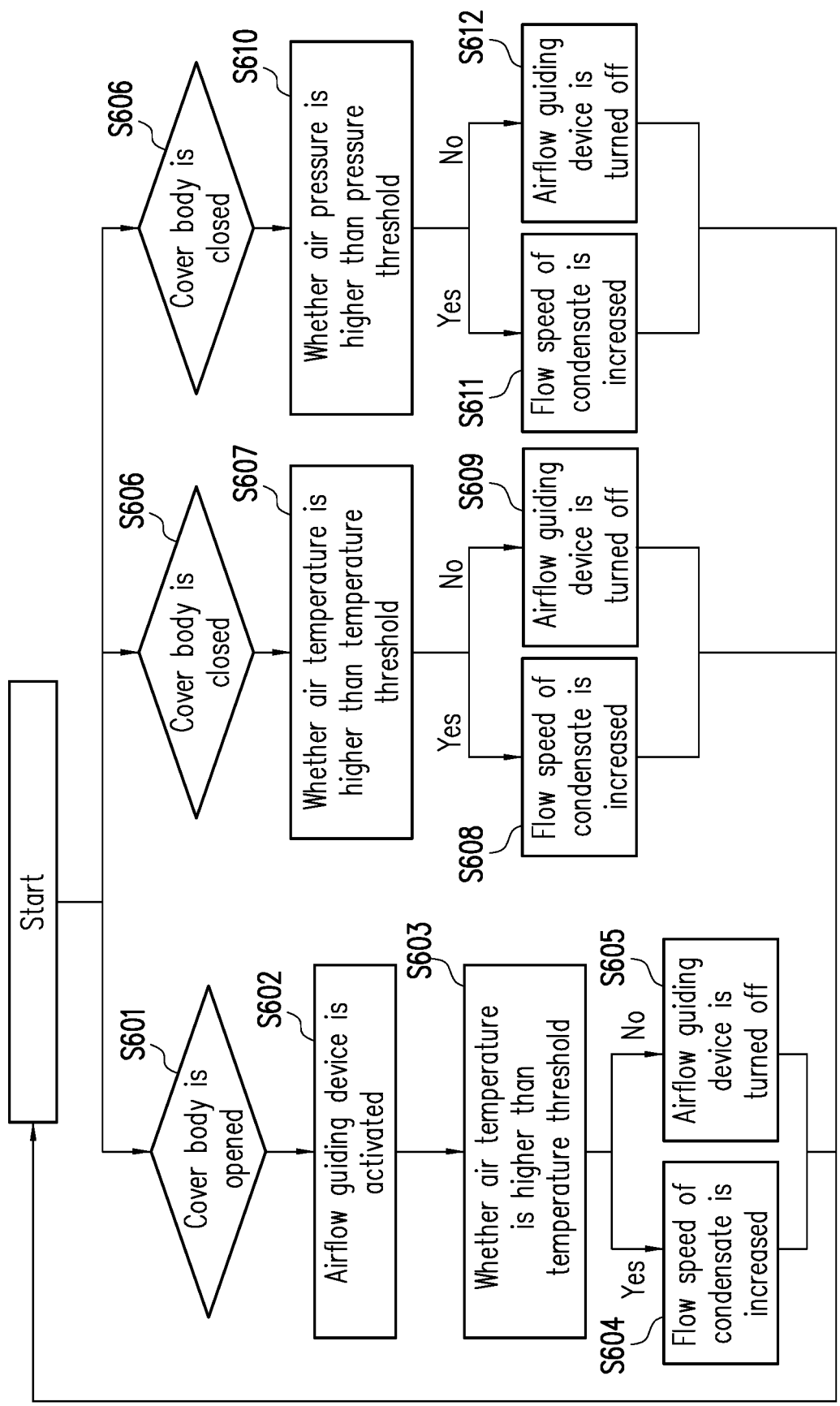
FIG. 6 is a flow chart of the actuation of the electronic apparatus of FIG. 1.

FIG. 6 is a flow chart of the actuation of the electronic apparatus of FIG. 1. Referring to FIG. 6, when the cover body 120 is opened (step S601), the airflow guiding device 150 is activated (step S602). On this occasion, the control unit 160 determines whether the temperature of the air in the containing space of the box body 110 is greater than the temperature threshold T1 according to the temperature sensed by the temperature sensor 170 (step S603). When the temperature sensor 170 senses that the temperature of the air in the containing space is higher than the temperature threshold T1, it represents that the amount of the gaseous heat dissipation medium is greater than the critical value, which causes that the position of the vapor line V is too high and the gaseous heat dissipation medium is more likely to escape to the outside environment. On this occasion, the control unit 160 controls the flow speed of the condensate in the condensing structure 140 to increase (step S604) to speed up the condensing speed of the heat dissipation medium and avoid the escape of the gaseous heat dissipation medium. Conversely, when the temperature sensor 170 senses that the temperature of the air in the containing space is not higher than the temperature threshold T1, it represents that the amount of the gaseous heat dissipation medium is less than the critical value, and therefore the gaseous heat dissipation medium is less likely to escape to the outside. On this occasion, the control unit 160 can control the airflow guiding device 150 to turn off (step S605) to save power consumption. In step S605, it is also possible to choose not to turn off the airflow guiding device 150 to ensure that the gaseous heat dissipation medium does not escape to the outside, the present disclosure provides no limitation thereto.

On the other hand, when the cover body 120 is closed (step S606) to cover the box body 110, the control unit 160 determines whether the temperature of the air in the containing space of the box body 110 is higher than the threshold T2 according to the temperature sensed by the temperature sensor 170 (step S607). When the temperature sensor 170 senses that the temperature of the air in the containing space is higher than the temperature threshold T2, it represents that the amount of the gaseous heat dissipation medium is greater than a critical value, which causes that the position of the vapor line V is too high and the gaseous heat dissipation medium is more likely to escape to the outside from the gap between the box body 110 and the cover body 120. On this occasion, the control unit 160 controls the airflow guiding device 150 to activate and controls the flow speed of the condensate in the condensing structure 140 to increase (step S608) to avoid the escape of the gaseous heat dissipation medium. Conversely, when the temperature sensor 170 senses that the temperature of the air in the containing space is not higher than the temperature threshold T2, it represents that the amount of the gaseous heat dissipation medium is less than the critical value, and therefore the gaseous heat dissipation medium is less likely to escape to the outside. On this occasion, the control unit 160 can control the airflow guiding device 150 to turn off (step S609) to save power consumption. In step S609, it is also possible to choose not to turn off the airflow guiding device 150 to ensure that the gaseous heat dissipation medium does not escape to the outside, the present disclosure provides no limitation thereto.

In addition, when the cover body 120 is closed (step S606) to cover the box body 110, the control unit 160 can further determine whether the air pressure in the containing space of the box body 110 is greater than the pressure threshold P according to the pressure sensed by the pressure sensor 180 (step S610). When the pressure sensor 180 senses that the air pressure in the containing space is higher than the pressure threshold P, it represents that the amount of the gaseous heat dissipation medium is greater than the critical value, which causes that the position of the vapor line V is too high and the gaseous heat dissipation medium is more likely to escape to the outside from the gap between the box body 110 and the cover body 120. On this occasion, the control unit 160 controls the airflow guiding device 150 to activate and controls the flow speed of the condensate in the condensing structure 140 to increase (step S611) to avoid the escape of the gaseous heat dissipation medium. Conversely, when the pressure sensor 180 senses that the air pressure in the containing space is not higher than the pressure threshold P, it represents that the amount of the gaseous heat dissipation medium is smaller than the critical value, and therefore the gaseous heat dissipation medium is less likely to escape to the outside. On this occasion, the control unit 160 can control the airflow guiding device 150 to turn off (step S612) to save power consumption. In step S612, it is also possible to choose not to turn off the airflow guiding device 150 to ensure that the gaseous heat dissipation medium does not escape to the outside, the present disclosure provides no limitation thereto.

As shown in FIG. 1 and FIG. 2, the electronic apparatus 100 of the present embodiment further includes a display interface 190. The display interface 190 is disposed outside the box body 110 and is adapted to display information such as physical measurement parameters (such as temperature, pressure) and images in the containing space of the box body 110 for users to watch.

Figure 7:
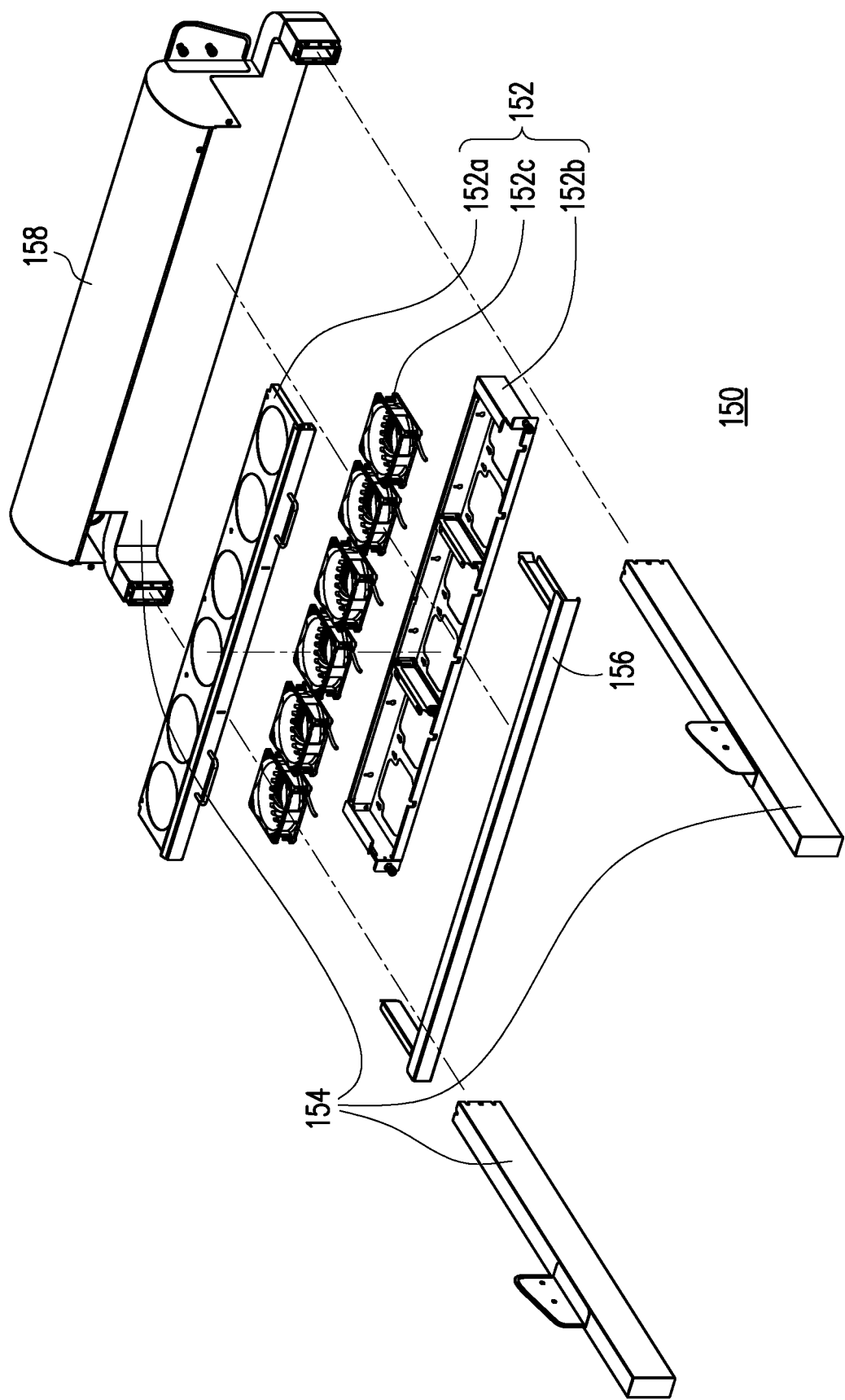
FIG. 7 is an exploded view of the airflow guiding device of FIG. 4.

FIG. 7 is an exploded view of the airflow guiding device of FIG. 4. Referring to FIG. 7, the airflow guiding device 150 of the present embodiment includes at least one airflow generating device 152 and an airflow passage 154. The airflow generating device 152 is, for example, a fan and is adapted to generate a guiding airflow for driving the gaseous heat dissipation medium to flow along the airflow passage 154 to the first condensing portion 142 shown in FIG. 3. Specifically, the rotation speed of the airflow generating device 152 can be determined according to the heat dissipation requirement of the electronic apparatus 100.

Further, the airflow generating device 152 includes an upper housing 152a, a lower housing 152b, and a plurality of airflow generating units 152c. The upper housing 152a and the lower housing 152b are assembled together to cover the airflow generating unit 152c. The airflow guiding device 150 further includes a guiding structure 156 connected to the lower end of the airflow generating device 152 for guiding the air from the airflow generating device 152 toward the first condensing portion 142 below the airflow generating device.

Figure 8:
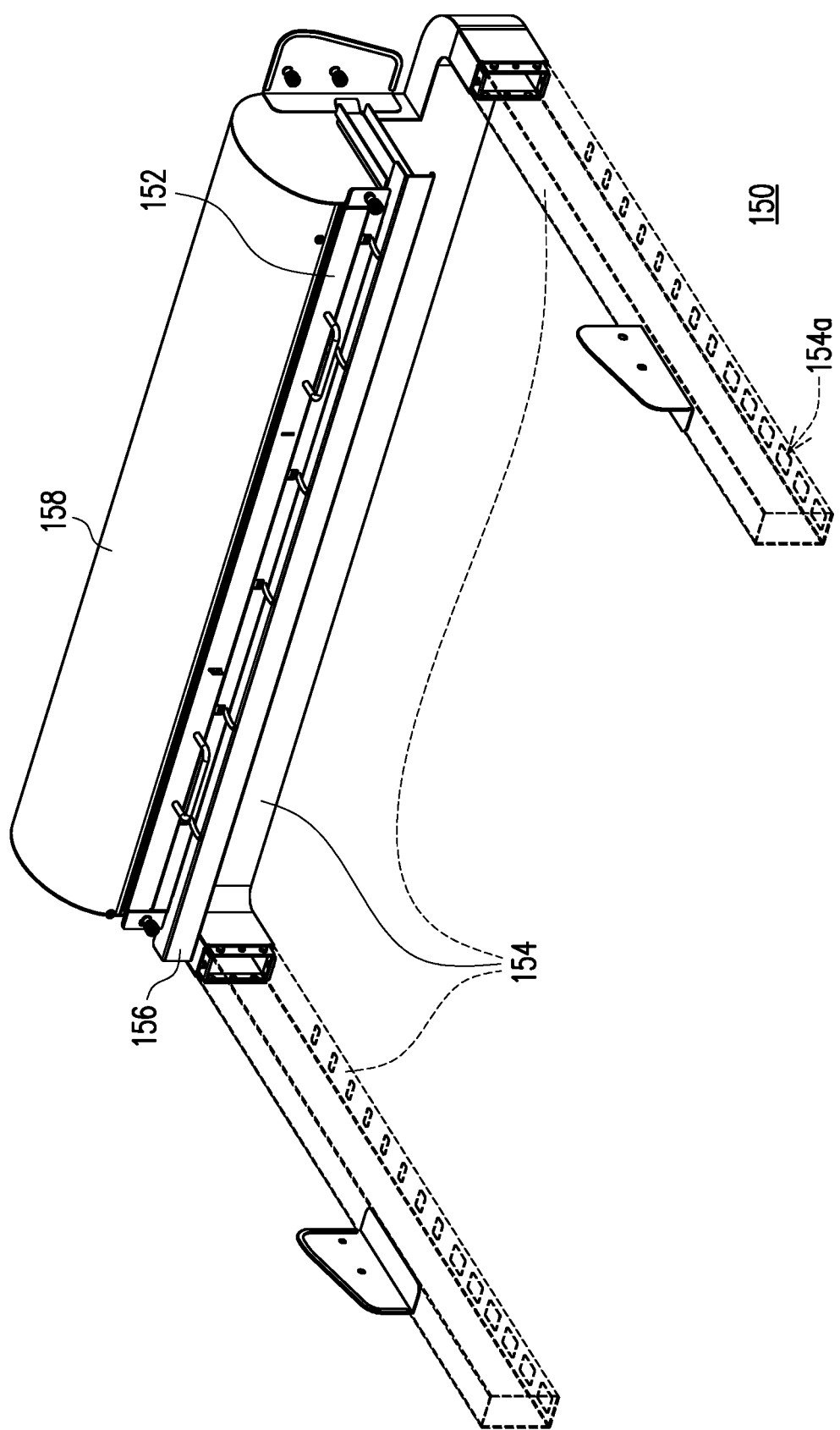
FIG. 8 is a perspective view of the airflow guiding device of FIG. 4.

FIG. 8 is a perspective view of the airflow guiding device of FIG. 4. Specifically, the airflow passage 154 is constituted, for example, by a plurality of conduits that extend along the edge of the containing space of the box body 110 and has a plurality of air inlets 154a as shown in FIG. 8, the guiding airflow enters the conduit through the air inlets 154a and flow toward the airflow generating device 152. Further, since the airflow generating device 152 generates a smaller airflow guiding force for the air inlet 154a farther from the airflow generating device 152, the apertures of the air inlets 154a can be designed to be proportional to the distance between the air inlets 154a and the airflow generating device 152 as shown in FIG. 8. As such, the air inlets 154a farther from the airflow generating device 152 have larger apertures to make the amount of intake air of the air inlets 154a uniform.

In the present embodiment, the conduit includes a main body portion (the airflow passage 154 indicated by a solid line in FIG. 8) corresponding to the airflow generating device 152, and includes two arm portions (the airflow passage 154 indicated by a broken line in FIG. 8) corresponding to the second condensing portion 144 and extending from both ends of the main body portion. In other embodiments, the second condensing portion 144 may not be provided and the arm portion may not be provided, the present disclosure provides no limitation thereto.

Figure 9:
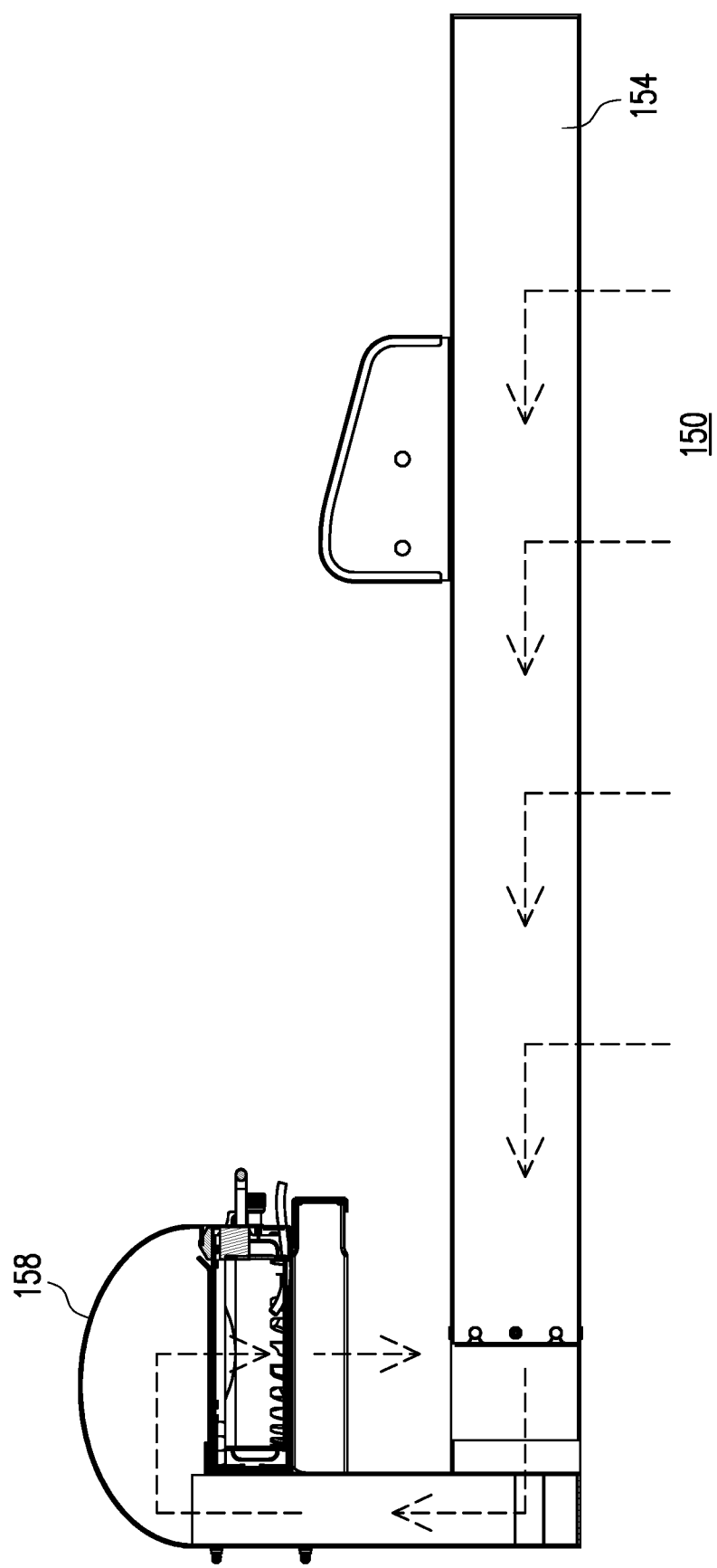
FIG. 9 is a partial cross-sectional view of the airflow guiding device of FIG. 4.

FIG. 9 is a partial cross-sectional view of the airflow guiding device of FIG. 4. In the present embodiment, the airflow guiding device 150 includes a mask 158 that is connected between the airflow generating device 152 and the airflow passage 154. The guiding airflow from the airflow passage 154 is adapted to flow through the mask 158 toward the airflow generating device 152 along the flow direction shown in FIG. 9, and flows through the airflow generating device 152 toward the first condensing portion 142 shown in FIG. 1.

Figure 10:
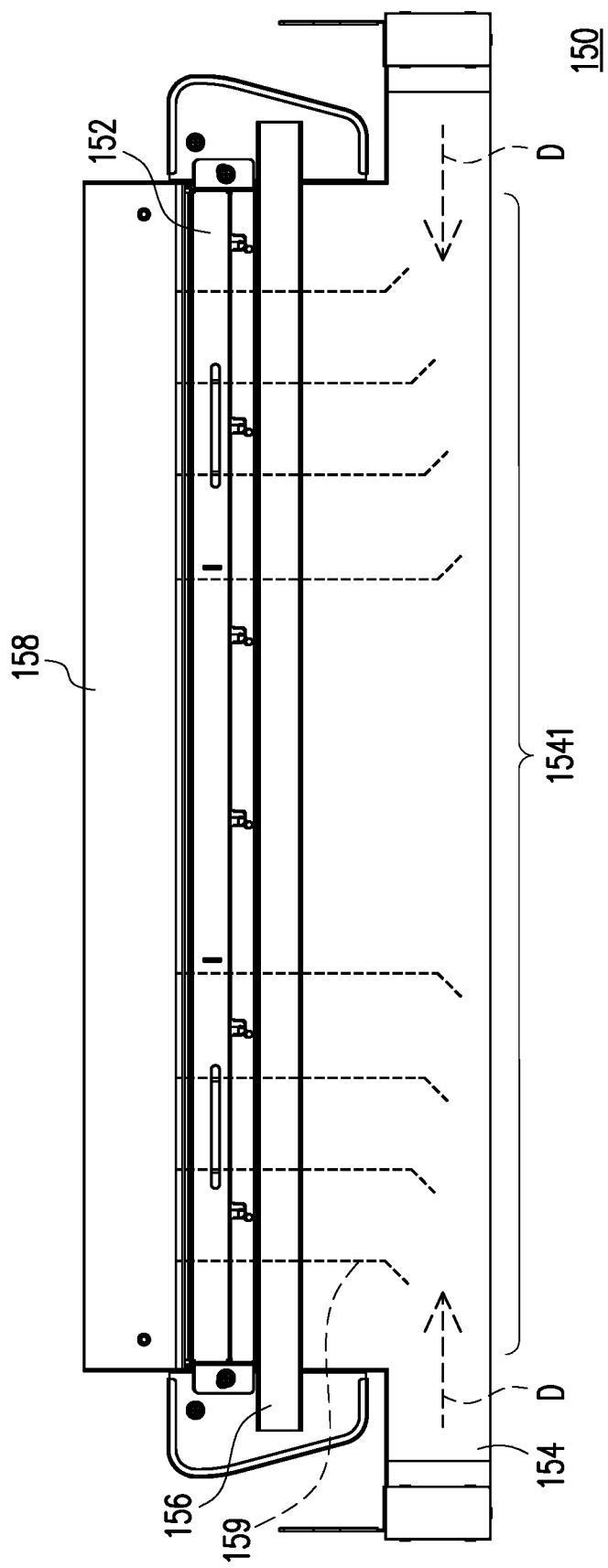
FIG. 10 is a front view of the airflow guiding device of FIG. 4.

FIG. 10 is a front view of the airflow guiding device of FIG. 4. Referring to FIG. 10, in the present embodiment, a segment 1541 of the airflow passage 154 is connected to the mask 158, and the guiding airflow flows along the flow direction D toward the center of the segment 1541 of the airflow passage 154. The airflow guiding device 150 includes a plurality of stoppers 159 which are disposed in the segment 1541 of the airflow passage 154 and are arranged along the flow direction D. The length of the stoppers 159 is inversely proportional to the distance between the stoppers 139 and the center of the segment 1541 of the airflow passage 154, such that the stoppers 159 closer to the center of the segment 1541 of the airflow passage 154 have a greater length in the direction perpendicular to the flow direction D. In this manner, it is possible to avoid that the guiding airflow is excessively concentrated in the center of the segment 1541 of the airflow passage 154 before being driven downward by the airflow generating device 152, so that the airflow generating device 152 can uniformly drive the guiding airflow to flow downward.

As shown in FIG. 3, a part of the condensing pipe set (second condensing portion 144) of the present embodiment is located below the conduit (the airflow passage 154), and the air inlet 154a (shown in FIG. 8) of the conduit (the airflow passage 154) is formed on the lower surface of the conduit (airflow passage 154) and faces the condensing pipe set (second condensing portion 144). However, the present disclosure provides no limitation to the relative arrangement positions of the condensing pipe set and the conduit. In other embodiments, a part of the condensing pipe set (the second condensing portion 144) may be surrounded by the conduit (the airflow passage 154) and located at the edge of the conduit (the airflow passage 154), and the air inlet 154a (shown in FIG. 8) of the conduit (the airflow passage 154) is formed on the lateral surface of the conduit (the airflow passage 154) and faces the condensing pipe set (the second condensing portion 144). In addition, in other embodiments, the airflow generating device 152 and the airflow passage 154 may be formed in the side wall of the box body 110 to further save the configuration space in the box body 110.

Figure 12:
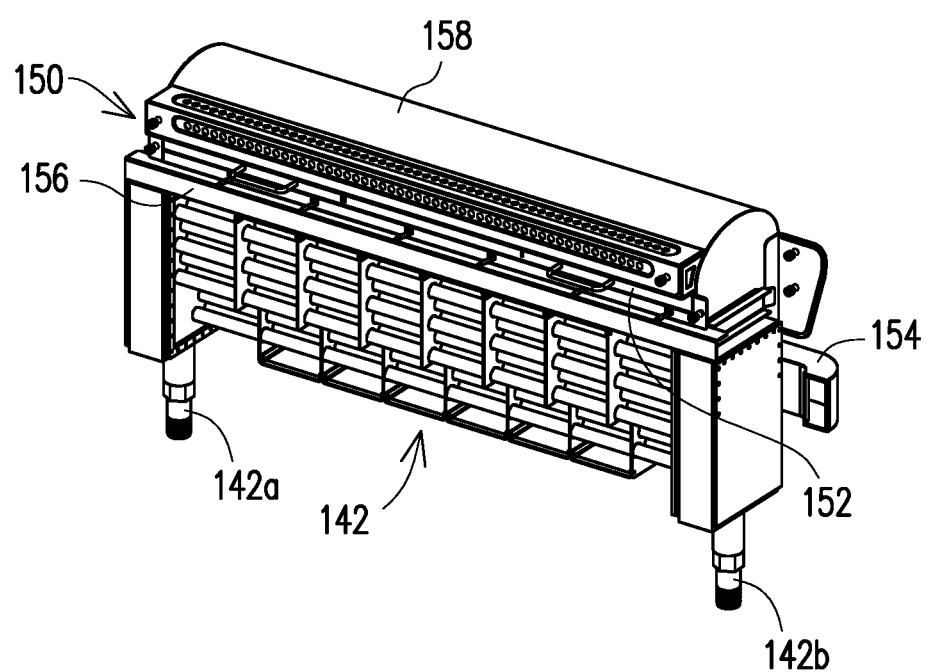
FIG. 12 illustrates the configuration of the immersion cooling module of FIG. 3 omitting part of the structure.

FIG. 12 illustrates the configuration of the immersion cooling module of FIG. 3 omitting part of the structure. Compared with the embodiment shown in FIG. 3, the airflow passage 154 of the airflow guiding device 150 can be changed to an extending arm omitting both sides as shown in the embodiment of FIG. 12, and correspondingly omitting the configuration of the second condensing portion 144, thereby increasing the available area of the containing space in the box body 110 (shown in FIG. 1).

In summary, the electronic apparatus of the present disclosure is provided with an airflow guiding device, and the gaseous heat dissipation medium in the box body can be forcibly guided to the condensing structure through the airflow guiding device. In this manner, it is possible to prevent the gaseous heat dissipation medium from unexpectedly escaping to the outside environment. In addition, by forcibly guiding the gaseous heat dissipation medium to the condensing structure through the airflow guiding device, the condensation efficiency of the heat dissipation medium can be increased, thereby improving the heat dissipation capability of the electronic apparatus.

Although the present disclosure has been disclosed in the above embodiments, it is not intended to limit the present disclosure, and those skilled in the art can make some modifications and refinements without departing from the spirit and scope of the disclosure. Therefore, the scope to be protected by the present disclosure is subject to the scope defined by the appended claims.

What is claimed is:
1. An electronic apparatus, comprising:
  a box body, having a containing space, wherein the containing space is adapted to contain a heat dissipation medium;

at least one heat generating element, disposed in the containing space and immersed in the liquid heat dissipation medium, wherein the liquid heat dissipation medium is adapted to be gasified into a gaseous heat dissipation medium through thermal energy of the at least one heat generating element; and an immersion cooling module, comprising a condensing structure and an airflow guiding device, wherein the condensing structure is disposed in the containing space and comprises a first condensing portion, the airflow guiding device is disposed in the box body, and is adapted to guide the gaseous heat dissipation medium toward the first condensing portion, wherein the condensing structure and the airflow guiding device are disposed along side walls of the box body.

2. The electronic apparatus of claim 1, comprising a cover body, wherein the cover body is adapted to cover the box body to seal the containing space, and the cover body is adapted to be opened relative to the box body to expose the containing space to the outside.

3. The electronic apparatus of claim 2, wherein the airflow guiding device is activated when the cover body is opened relative to the box body.

4. The electronic apparatus of claim 1, wherein the immersion cooling module comprises at least one sensor, the at least one sensor is disposed in the containing space, when the at least one sensor senses that an air temperature in the containing space is higher than a temperature threshold or an air pressure in the containing space is higher than a pressure threshold, the airflow guiding device is activated.

5. The electronic apparatus of claim 4, wherein the immersion cooling module comprises a control unit, when the at least one sensor senses that the air temperature in the containing space is higher than the temperature threshold or the air pressure in the containing space is higher than the pressure threshold, the control unit controls a flow speed of a condensate in the condensing structure to increase.

6. The electronic apparatus of claim 4, wherein the at least one sensor comprises at least one of a temperature sensor and a pressure sensor.

7. The electronic apparatus of claim 1, wherein the airflow guiding device comprises at least one airflow generating device and an airflow passage, the at least one airflow generating device is adapted to generate a guiding airflow, the guiding airflow drives the gaseous heat dissipation medium to flow toward the first condensing portion along the airflow passage.

8. The electronic apparatus of claim 7, wherein the airflow passage comprises at least one conduit extending along an edge of the containing space and having at least one air inlet.

9. The electronic apparatus of claim 8, wherein the at least one air inlet comprises a plurality of air inlets, an aperture of the air inlets is proportional to a distance between the air inlets and the at least one airflow generating device.

10. The electronic apparatus of claim 8, wherein the condensing structure comprises a second condensing portion, the second condensing portion is located below the at least one conduit, and the at least one air inlet faces the second condensing portion.

11. The electronic apparatus of claim 8, wherein the condensing structure comprises a second condensing portion surrounded by the at least one conduit, the at least one air inlet faces the second condensing portion.

12. The electronic apparatus of claim 7, wherein the airflow guiding device comprises a mask connected between the at least one airflow generating device and the airflow passage, the guiding airflow from the airflow passage is adapted to flow through the mask toward the at least one airflow generating device.

13. The electronic apparatus of claim 12, wherein a segment of the airflow passage is connected to the mask, the guiding airflow flows along a flow direction toward the center of the segment, the airflow guiding device comprises a plurality of stoppers disposed in the segment and arranged along the flow direction, a length of the stoppers is inversely proportional to a distance between the stoppers and the center of the segment.

14. The electronic apparatus of claim 7, wherein the at least one airflow generating device and the airflow passage are formed in a side wall of the box body.

15. The electronic apparatus of claim 1, wherein the condensing structure comprises a second condensing portion extending along an edge of the containing space.

16. The electronic apparatus of claim 1, comprising a display interface, wherein the display interface is disposed outside the box body and is adapted to display physical measurement parameters and images in the containing space.

17. The electronic apparatus of claim 1, wherein the electronic apparatus is a server, a storage or an exchanger.

18. An immersion cooling module, which is adapted for an electronic apparatus, the electronic apparatus comprising a box body and at least one heat generating element, the box body having a containing space adapted to contain a heat dissipation medium, wherein the at least one heat generating element is disposed in the containing space and immersed in the liquid heat dissipation medium, and the immersion cooling module comprising:

a condensing structure, disposed in the containing space and comprising a first condensing portion; and an airflow guiding device, disposed in the box body and is adapted to guide the gaseous heat dissipation medium toward the first condensing portion, wherein the condensing structure and the airflow guiding device are disposed along side walls of the box body.

19. The immersion cooling module of claim 18, wherein the airflow guiding device comprises at least one airflow generating device and an airflow passage, the at least one airflow generating device is adapted to generate a guiding airflow, the guiding airflow drives the gaseous heat dissipation medium to flow along the airflow passage toward the first condensing portion, the airflow guiding device comprises a mask connected between the at least one airflow generating device and the airflow passage, the guiding airflow from the airflow passage is adapted to flow through the mask toward the at least one airflow generating device.

20. The immersion cooling module of claim 18, wherein the condensing structure comprises a second condensing portion extending along an edge of the containing space.

* * * * *